United States Patent

Fukunaga et al.

[11] Patent Number: 6,036,783
[45] Date of Patent: Mar. 14, 2000

[54] LIQUID MATERIAL VAPORIZER APPARATUS AND GAS EJECTION DEVICE

[75] Inventors: Yukio Fukunaga, Yokohama; Takeshi Murakami; Naoaki Ogure, both of Tokyo; Akihisa Hongo, Yokohama, all of Japan

[73] Assignee: Ebara Corporation, Tokyo, Japan

[21] Appl. No.: 08/834,593

[22] Filed: Apr. 7, 1997

[30] Foreign Application Priority Data

Apr. 5, 1996 [JP] Japan ................................. 8-110282

[51] Int. Cl.$^7$ ................................................. C23C 16/00
[52] U.S. Cl. ........................... 118/724; 118/726; 392/394
[58] Field of Search .................................. 118/715, 726, 118/724; 392/394

[56] References Cited

U.S. PATENT DOCUMENTS

| | | | |
|---|---|---|---|
| 4,847,469 | 7/1989 | Hofmann | 219/273 |
| 5,224,202 | 6/1993 | Arnold et al. | |
| 5,252,134 | 10/1993 | Stauffer | 118/726 |
| 5,435,850 | 7/1995 | Rasmussen | 118/726 |
| 5,462,014 | 10/1995 | Awaya | 118/726 |

FOREIGN PATENT DOCUMENTS

| | | |
|---|---|---|
| 0 533 201 | 3/1993 | European Pat. Off. . |
| 41 07 756 | 9/1991 | Germany . |
| 6-291040 | 10/1994 | Japan . |
| 6-310444 | 11/1994 | Japan . |

OTHER PUBLICATIONS

Patent Abstracts of Japan, vol. 014, No. 390 (C–0751), Aug. 23, 1990 & JP 02 145768 A (Koujiyundo Kagaku Kenkyusho:KK), Jun. 5, 1990 *abstract*.

*Primary Examiner*—Richard Bueker
*Attorney, Agent, or Firm*—Wenderoth, Lind & Ponack, L.L.P.

[57] ABSTRACT

A vaporizer apparatus enables efficient vaporization of a liquid material for the production of high dielectric thin film devices by allowing a sufficient dwell time for complete vaporization of the feed liquid. The vaporizer apparatus also prevents degradation of the feed gas after vaporization and provides a stable supply of the vaporized feed gas to the substrate. The vaporizer apparatus comprises an outer member having a cylindrical inner surface, and an inner member having a cylindrical outer surface opposing the cylindrical inner surface of the outer member. A feed material passage having a spiral configuration is formed on at least one of the cylindrical inner surface and the cylindrical outer surface. The feed material passage communicates with a feed liquid entry opening and a feed gas exit opening. A heating device is provided for heating at least one of the outer member and inner member.

20 Claims, 5 Drawing Sheets

LIQUID MATERIAL VAPORIZER APPARATUS AND GAS EJECTION DEVICE

BACKGROUND OF THE INVENTION

1. Field of the Invention

The present invention relates in general to a vaporizer apparatus for vaporizing a liquid material in order to provide a gaseous material for a chemical vapor deposition apparatus, for example. In particular, it relates to a vaporizer apparatus suitable for producing a vapor material for making a thin film having a high dielectric constant such as barium or strontium titanate.

2. Description of the Related Art

In recent years, there has been a remarkable advancement in circuit density of integrated circuit devices produced by the semiconductor industries, and intense development activities are in progress in anticipation of gega-bit order DRAMs replacing the prevailing mega-bit order DRAMs of today. Dielectric thin film materials used to make high capacitance devices necessary for DRAMs have, in the past, included silicon oxide or silicon nitride films of dielectric constant less than 10, or tantalum pentaoxide ($Ta_2O_5$) films of dielectric constant of approximately 20. However, newer materials such as barium titanate ($BaTiO_3$) or strontium titanate ($SrTiO_3$) or mixtures of these compounds appear to be more promising.

In order to make such thin films, chemical vapor deposition (CVD) process is deemed to be promising. In this case, it is necessary that a feed gas must ultimately be supplied in a stable gas stream to a substrate disposed in a reaction vessel. In order to stabilize the vaporization characteristics, the feed gas is derived by heating a liquid source. The liquid source is produced by dissolving such materials as $Ba(DPM)_2$ or $Sr(DPM)_2$, which are solid at normal temperature, in some organic solvent (for example, THF).

A conventional vaporizer apparatus is disclosed in Japanese Patent Application Laid Open Publication No. H6-310444, for example, in which a liquid material or an atomized liquid material is injected into a chamber-type vaporizer which is heated by a heater. It also discloses a vaporizing plate in front of an injection nozzle for providing an improved heat conductivity for a better vaporization efficiency.

The vaporized gas prepared in the vaporizer is led into a reactor (film depositing chamber) through a feed gas distribution pipe, and is then led to the ejection head to be mixed with a reactive gas (oxidizing gas) supplied from the reactive gas delivery pipe. The vapor jet is directed to the substrate to produce a reaction so as to deposit a thin film (oxide film) on the substrate.

The feed gas used in such a deposition apparatus for making high dielectric films has the following intrinsic properties which present certain operational difficulties. They are: (1) the vaporization and decomposition temperatures are close together; (2) a difference exists in the vaporization temperatures between the film producing gas and the organic solvent; and (3) the vapor pressures are all very low. These characteristics cause difficulty in vaporizing the material and maintaining the stable flow of vaporized gas.

In the conventional technology, because the heat for vaporization is supplied by conduction from vaporizer plates disposed on the walls or interior of a box-shaped vaporizer, the vaporization efficiency from liquid to gas phase is not adequate. Also, the pressure within the reaction vessel is of the order of several torrs, for example 5 torr, resulting in a large difference in the pressures between the vaporizer and the reaction vessel. Therefore, as the gas passes through the vaporizer, the feed gas pressure is gradually reduced. The reduction in pressure is accompanied by volume expansion, so the velocity of the feed gas through the vaporizer is gradually accelerated. Consequently, there is a possibility that the feed gas passes through the vaporizer at high velocity without being completely vaporized.

Therefore, to prevent such a phenomenon and to vaporize the feed material completely within the vaporizer, it is necessary to provide sufficient dwell time for the feed gas to be vaporized. However, the size of the vaporizer necessary to accomplish such an objective becomes too large, and the length of the feed gas distribution pipe (from the vaporizer to the film depositing chamber) becomes too long. Thus, the possibility of an undesirable premature precipitation reaction from the gas phase increases. This further creates a cost problem for additional equipment and maintenance work for maintaining the feed gas distribution pipe at a high temperature.

Furthermore, if the feed gas and the reactive gas are delivered into the reaction vessel through separate delivery systems, the distributions of the feed gas and the reactive gas above the substrate surface can be non-uniform. This creates a product quality problem of composition or thickness non-uniformity in the film on the substrate which is a direct reflection of the non-uniformity of the feed gas.

SUMMARY OF THE INVENTION

It is an object of the present invention to provide a vaporizer apparatus which can efficiently vaporize a liquid material for the production of high dielectric thin film devices by allowing a sufficient dwell time for complete vaporization of the feed liquid. Thus, degradation of the feed gas after vaporization is prevented, and a stable supply of the vaporized feed gas to the substrate is provided. Another object of the present invention is to develop a compact vaporizer to enable efficient mixing of the feed gas and reactive gas.

These objects have been achieved in a vaporizer apparatus comprising: an outer member having a cylindrical inner surface; an inner member having a cylindrical outer surface opposing the cylindrical inner surface of the outer member; a feed material passage having a spiral configuration formed on at least one of the cylindrical inner surface and the cylindrical outer surface, where the feed material passage communicates with a feed liquid entry opening and a feed gas exit opening; and a heating device for heating at least one of the outer member and inner member.

The vaporizer presented above enables a high efficiency to be achieved in converting a feed liquid to a feed gas by forcing the liquid material through a long flow passage and by improving the contact efficiency.

An aspect of the apparatus is that the outer member and the inner member are arranged so as to be relatively rotatable with respect to each other. The apparatus comprises a drive source to rotate at least one of the outer member and the inner member. The vaporizer enables a high efficiency to be achieved by improving the contact efficiency of the material with the heated wall by rotation.

The presence of the pressure generation section allows a back pressure to be maintained in the upstream section of the flow passage so as to prevent premature evaporation of organic solvent as well as to provide a sufficient retention time within the flow passage to further assure a complete conversion of the feed liquid to a feed gas.

Another aspect of the apparatus is that the inner and outer members are attached to a reaction vessel at a downstream location of the feed material passage. Accordingly, the film deposition section and the vaporizer section are made into a unit to save space and shorten the delivery distance over which the vaporized feed gas must be transported as well the distance for the heating medium flow path.

Another aspect of the apparatus is that a mixing space is provided at a location downstream of the feed material passage for mixing a feed gas (which descends through the feed material passage) with a reactive gas (introduced from an external source). Thereby, the feed gas and the reactive gas can be mixed in the mixing space close to the jetting nozzle to prevent degradation of the process gas.

Still another aspect of the apparatus is that the pressure generation section is provided to communicate with a downstream end of the feed material passage, and is provided with an impeller which rotates in an interior of the mixing space. Accordingly, the impeller serves to block the free flow of the feed material in order to maintain the back pressure in the upstream section. The impeller also performs complete mixing of the feed gas and reactive gas to produce a uniformly mixed process gas to be introduced into the gas ejection head.

Still another aspect of the apparatus is that the pressure generation section comprises a convexoconcave structure formed on at least one of the inner member and the outer member. Accordingly, the back pressure can be maintained because the fine spacing of the convexoconcave surface serves to block the unimpeded or free flow of the feed material.

Still another aspect of the apparatus is that a gas ejection head having nozzles for producing a feed gas flow onto a substrate communicates with a downstream end of the feed material passage, so that the vapor path distance is shortened.

Still another aspect of the apparatus is that the gas ejection head is formed as a unit with a rotating portion. Accordingly, the vaporized feed gas (or a mixture of feed gas and reactive gas) is mixed inside the gas ejection head to shorten the flow low path so as to prevent a degradation of the process gas, thereby improving the uniformity of the deposit.

Still another aspect of the apparatus is that a stepped section is formed at a location downstream of the feed material passage provided on one of the members, and the pressure generation section is comprised of a centrifugal impeller provided in the stepped section. Accordingly, the centrifugal impeller is used to serve as the pressure generation section to reverse the flow of feed gas, thereby preventing free flow of the feed material to maintain the upstream pressure.

Still another aspect of the apparatus is that the outer member is stationary and the inner member is rotated. Accordingly, the centrifugal force serves to improve the contact efficiency.

In another aspect of the invention, a gas ejection device for ejecting feed gas onto a substrate disposed in a reaction vessel comprises a vaporizer section for generating a feed gas by heating a liquid material, and a gas ejection head section for producing a flow of the feed gas onto the substrate. The vaporizer section and the gas ejection head section are arranged to form a thermally homogeneous unit. Accordingly, the vaporized feed gas does not suffer any temperature variations during its transport to the gas ejection head section. It follows that the problem of premature precipitation reaction and plugging of the passages are prevented, thereby enabling the vaporized feed gas to undergo a stable deposition reaction to produce a high quality thin film product.

Another aspect of the feed gas ejection device is that the vaporizer section and the gas ejection head section share a common casing. Thus, the vaporized feed gas can be supplied directly to the gas ejection head in a short flow passage without being subjected to variations in temperature. Accordingly, premature reaction or precipitation can be avoided before the feed gas is introduced into the film depositing compartment.

Another aspect of the feed gas ejection device is that the casing is provided with a heating medium passage common to the vaporizer section and the gas ejection head section. Accordingly, both the vaporizer section and the ejection head section can be maintained at a constant temperature.

Another aspect of the feed gas ejection device is that the vaporizer section comprises: an outer member having a cylindrical inner surface; an inner member having a cylindrical outer surface opposing the cylindrical inner surface of the outer member; a feed material passage having a spiral configuration formed on at least one of the cylindrical inner surface and the cylindrical outer surface, where the feed material passage communicates with a feed liquid entry opening and a feed gas exit opening; and a heating device for heating at least one of the outer member and inner member Accordingly, the same type of geometry for confining the feed material is effective in producing completely vaporized feed gas.

DESCRIPTION OF THE PREFERRED EMBODIMENTS

Figure 1:
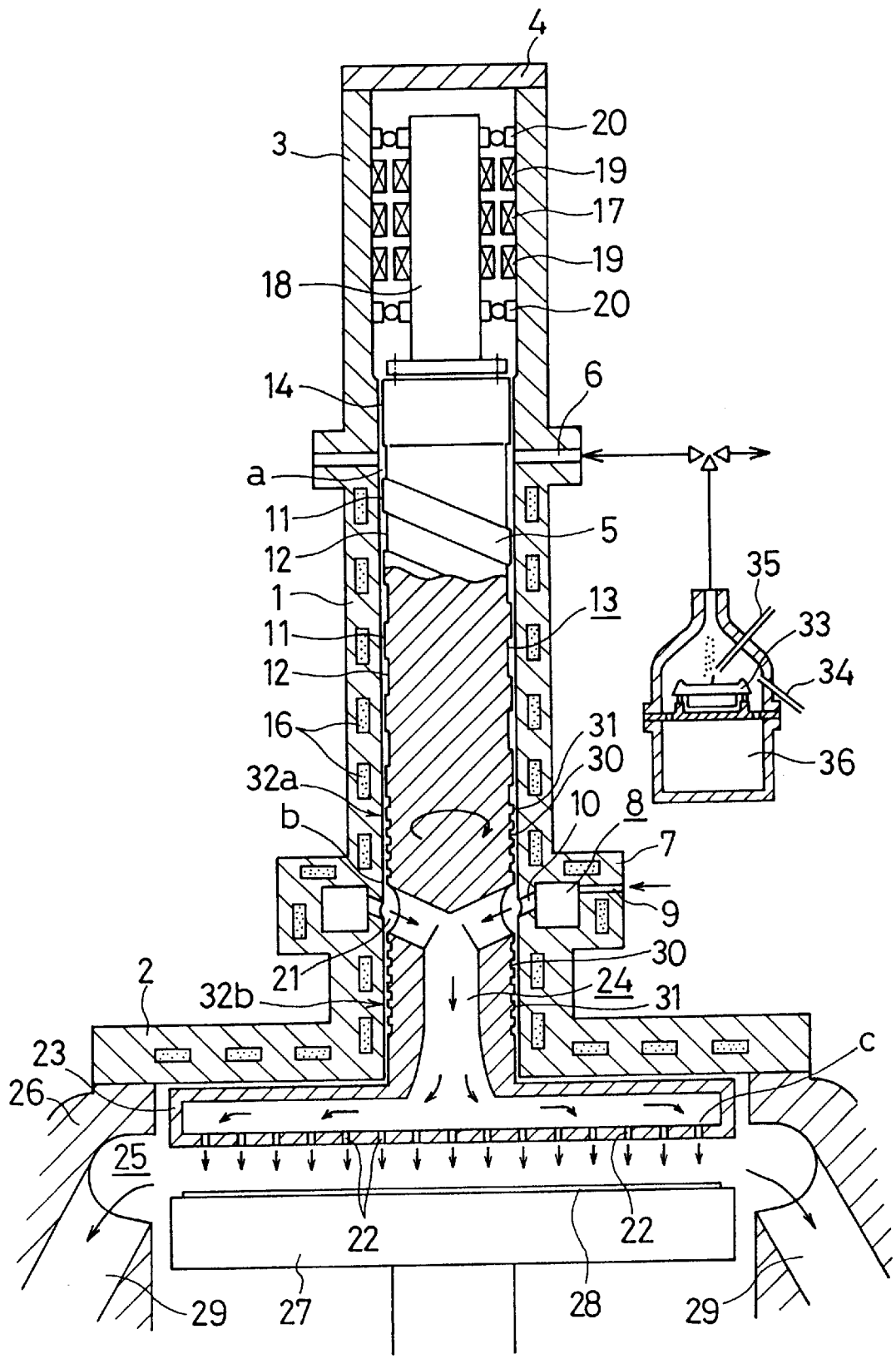
FIG. 1 is an overall cross sectional view of the a first embodiment of the apparatus.

FIG. 1 is a schematic diagram of a gas ejection apparatus comprising a vertical type vaporizer section unified with a gas ejection head. This example shows a type in which the feed material flows from the top to the bottom of the apparatus. An outer shell (outer member) 1, planar base section 2 and the upper motor section 3 are made of a heat resistant material (such as metal) as a unit, and the unit's upper terminal end section is closed with a ceiling plate 4. An inner shell (inner member) 5 disposed inside the outer shell 1 with a narrow space therebetween, is also made of a heat resistance material such as metal. The clearance between the outer and inner shells 1, 5 is selected so as to provide a minimum possible distance along the wall while preventing the outer and inner shells to contact each other during rotation. The entire apparatus is designed to permit quick assembly and disassembly and minimize the short circuit flow of the fluid along the inner surface of the outer shell 1.

In the top section of the outer shell 1, a plurality of feed entry openings 6 for atomized liquid material are provided which extend tangentially and open at circumferentially equidistant positions. The number and the location of the feed entry openings 6 should be determined case by case according to the requirements of the system. The outer shell 1 is provided with a large diameter section 7 located slightly above the base section 2. The larger diameter section 7 accommodates a ring-shaped gas dwelling section 8 having reactive gas entry openings 9 for supplying reactive gas to the gas dwelling section 8, and gas communication holes 10 which allow the gas dwelling section 8 to communicate with the internal space of the outer shell 1.

Line protrusions 11 of a trapezoidal cross sectional shape extend downward in a spiral manner on the outer peripheral surf ace of the inner shell 5. Thus, a groove 12 spirally extending between the line protrusions 11 in a similar manner is formed. The grooves 12 constitute spiral flow passages 13 disposed between the outer and inner shells 1, 5 to provide a flow path for feed material descending from the feed entry openings 6. The flow passage 13 extends downward from the feed entry openings 6. The inner shell 5 is made to extend slightly above the feed entry openings 6 and is provided with a protrusion ring 14 to prevent the feed liquid from overflowing.

On the interior wall of the outer shell 1, there is provided a heat medium passage 16 over the entire lower region (below the feed entry openings 6) to serve as a heating device. In addition, a control device is provided to control the temperature and flow rate of the heating medium flowing in the heating medium passage 16. Additionally, thermal insulating materials are provided, as necessary, on the outer surface of the outer shell 1.

The inner shell 5 is coupled to a drive shaft (rotor) 18 of a drive motor 17 housed in the motor section 3 of the outer shell 1 so that the inner shell 5 can be rotated by the drive motor 17. The drive shaft 18 is freely supported on a magnetic bearing 19 while maintaining a given spacing therebetween. At both the upper and lower sides of the magnetic bearing 19, there are provided touchdown bearings 20 for supporting the drive shaft 18 if the magnetic bearing 19 is made inoperative due to emergency situations such as power outage. The direction of rotation of the inner shell 5 is chosen to be the direction which would force the feed material downward along the spiral flow passages 13.

Regarding the magnetic bearing 19, it is usual to use an active control type magnetic bearing, but it is not necessary to only use this type. Other types, such as a passive type bearing based on permanent magnets, may also be used. The touchdown bearing 20 is usually a ball bearing, but because the surrounding temperature is high, it is preferable to use ceramic bearings. It is not necessary to only use ball bearings, and other types of bearings, such as slide bearings, may be used.

In a location facing the gas communication hole 10 in the inner shell 5, there is provided a mixing space 21. At the bottom end of the inner shell 5, there is an integrally connected gas ejection head 23 of a hollow disc design having a plurality of jetting nozzles 22.

The gas ejection head 23 protrudes below the base section 2 of the outer shell 1 into the film deposition compartment 25 of a sealed vessel 26 so that its lower surface, having the jetting nozzles 22, faces the film deposition compartment 25. In other words, the vaporizer apparatus is attached to the sealed vessel 26 so as to cover its upper open section with the base section 2. The gas ejection head 23 is disposed so as to face a substrate 28, such as a semiconductor wafer held on a pedestal 27. The sealed vessel 26 is provided with a discharge port 29 for externally discharging the spent gas.

The inner shell 5 includes an inner passage 24. On the outer surface of the inner shell 5 at both the top and bottom ends of the inner passage 24, there are provided respective pressure generation sections 32*a*, 32*b* formed by a plurality of finely spaced depression sections 30 and protrusion sections 31 which fit between the depression sections 30. The upper pressure generation section 32*a* is used to produce a back pressure for the feed gas which is gradually vaporized while flowing down along the flow passage 13 due to the action of the rotating inner shell 5. The upper pressure generation 32 produces back pressure by blocking uninterrupted downward flow of the feed gas.

Figure 2:
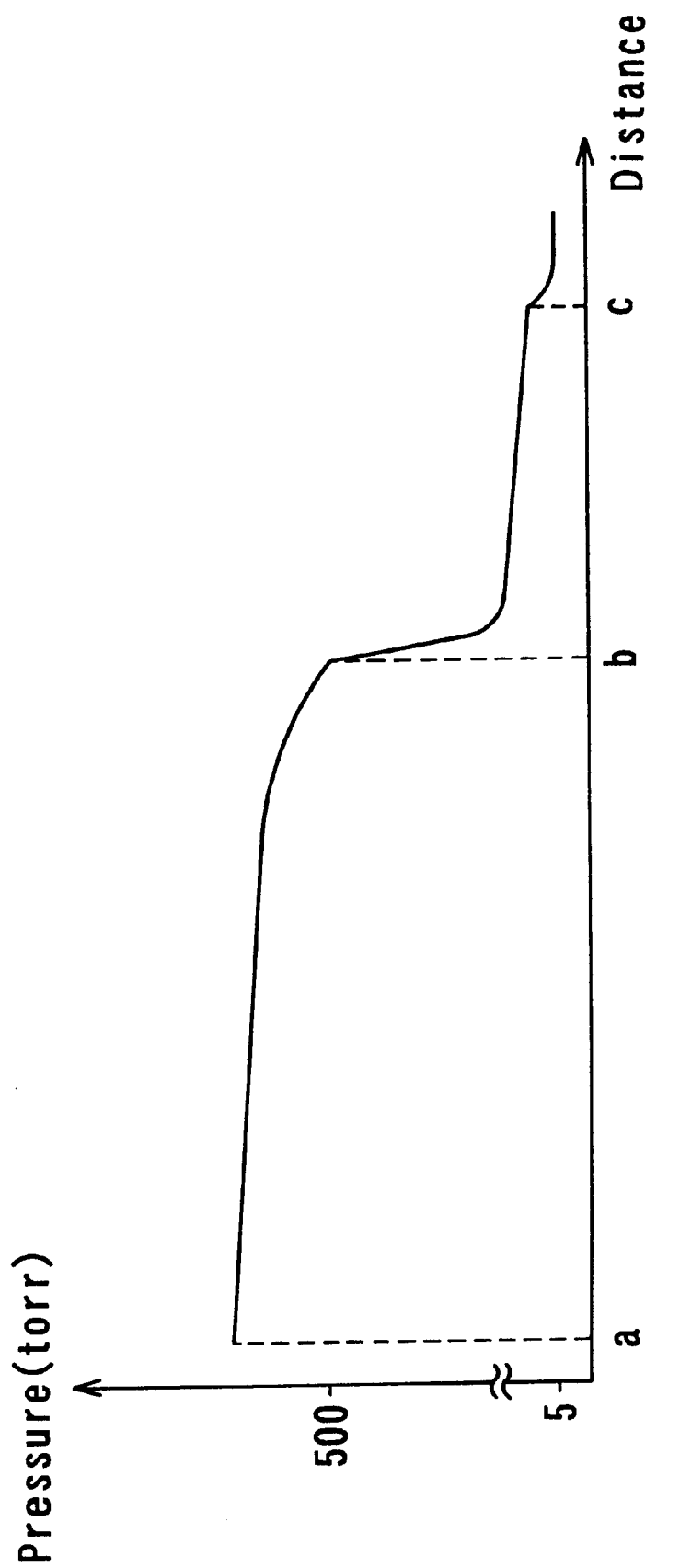
FIG. 2 is a graph showing a pressure distribution along the flow path of the feed material in the embodiment shown in FIG. 1.
Figure 3:
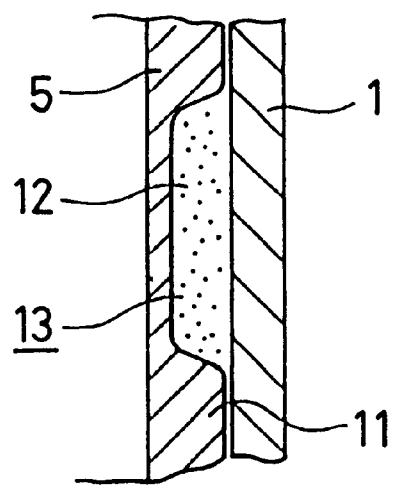
FIG. 3 is an enlarged view of the essential parts of FIG. 1.

The pressure changes in this section will be explained with reference to FIG. 2. At the feed entry opening 6 (location a), the environmental pressure is chosen to prevent a separation of the organic solvent, about 500 torr for example. The vaporized feed gas is injected from the jetting nozzles 22 (location c) of the gas ejection head 23 into the film deposition compartment 25 while being maintained at a pressure of about 5 torr. The function of the upper pressure generation section 32*a* is to maintain the upstream pressure by preventing uninterrupted downward flow of the feed material. Thus, it is designed to provide a sudden drop in pressure at about the boundary region (location b) of the upper pressure generation section 32*a*. The presence of the pressure generation section 32*a* at the bottom region of the flow passage 13 allows a sufficient dwell time for or the feed material in the flow passage 13 so that the feed material (mist mixed with vapor) can have ample contact time with the heated wall to undergo a complete conversion to vapor. The vaporized gas can then expand under progressively reducing pressures. This approach prevents sudden expansion of the feed gas that results in the feed material passing through the flow passage 13 without undergoing a full phase change process of a feed liquid converting to a feed gas.

On the other hand, the lower pressure generation section 32*b* serves a sealing function to prevent quick escape of process gas produced by mixing the feed gas with the reactive gas in the mixing space 21.

The vaporizer apparatus is operated by supplying atomized or partially atomized feed material to the feed entry openings 6. For this purpose, this apparatus is operated in conjunction with an atomizing device comprising an ultrasonic vibrator 33 supplied with feed liquid drops through a nozzle 35. A carrier gas, such as argon, is supplied through another nozzle 34 to carry the atomized feed. The space 36 located in the bottom region of the atomizing device is for trapping liquid or solid residues.

Figure 4:
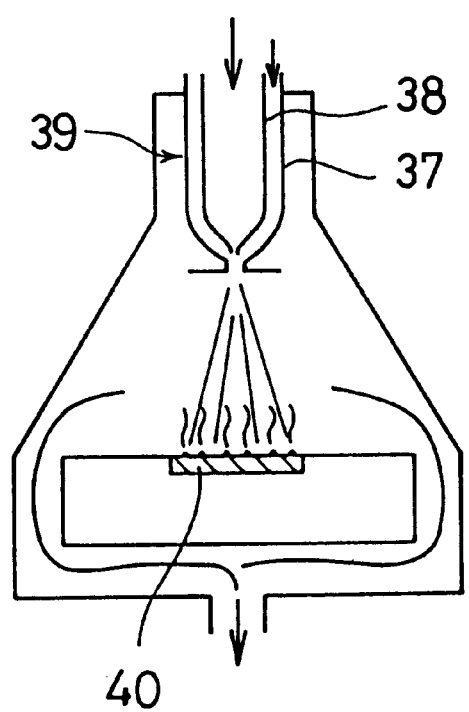
FIG. 4 is another embodiment of the atomizing section or vaporizer section used in the vaporizer apparatus of the present invention.

It should be noted that other atomizing arrangements such as that shown in FIG. 4 are also applicable. The known device of FIG. 4 has a double fluid passage nozzle 39, in which an outer nozzle 37 for carrier gas and an inner nozzle 38 for feed gas are used together. Mist may be produced by a known mist spray method. Other approaches include a hot plate 40 to partially vaporize the mist delivered through the double fluid passage nozzle 39.

The operation of the vaporizer apparatus will be explained below. The vaporizer apparatus is assembled by attaching the base section 2 of the outer shell 1 to the top opening section of the sealed vessel 26 (which includes the film deposition compartment 25) to seal off the opening section.

First, a liquid material is prepared by dissolving a feed material which is solid at room temperature, such as $Ba(DPM)_2$ or $Sr(DPM)_2$, in an organic solvent (e.g., THF) for stabilization of vapor properties.

The liquid material is atomized in the atomizer described above (note, the device in FIG. 4 will produce partially atomized, partially vaporized feed). The feed material is then introduced into the vaporizer apparatus through the feed entry opening 6, while the drive motor 17 is simultaneously activated to rotate the inner shell 5. The liquid material then enters the flow passages 13 provided on the outer surface of the inner shell 5, and following the rotation of the inner shell 5, the fluid feed is progressively forced downward. Along the way as it descends, the fluid feed comes into contact with the heated wall of the outer shell 1, and is gradually vaporized through thermal exchange.

The feed material descends while undergoing a spiraling motion, and the liquid material in a form of mist particles is scattered outward by the centrifugal force of rotation. The mist particles are therefore preferentially forced to contact the wall surface of the outer shell 1 to promote vaporization through thermal exchange. Also, the cross-sectional profile of the flow passage 13 is elongated in the axial direction. Therefore, a large contact area with the wall is created so that the thermal exchange process is further promoted. The interior volumes of all the flow passages 13 are selected to be the same throughout so as to prevent the formation of precipitation particles.

The feed material delivered along the flow passages 13 is then prevented from continuing to freely descend down when it enters into the upper pressure generation section 32a comprising a plurality of depression sections 30 and protrusion section 31. In other words, the feed material is allowed to dwell within the flow passage 13 for a certain duration of time without expanding under the high ambient pressure. Once the feed material is completely vaporized, the gasified feed material gradually leaks through the upper pressure generation 32a and enters into the mixing space 21.

The completely gasified feed material expands upon entering the mixing space 21, and mixes with the reactive gas (oxidizing gas) introduced from the reactive gas entry openings 9. The mixed process gas now enters into the gas ejection head 23 through the inner passage 24 of the inner shell 5. The process gas is directed to the surface of a substrate, such as the semiconductor wafer 28, through the jetting nozzles 22 of the gas ejection head 23 which is disposed inside the film deposition compartment 25. Thus, a thin film is formed on the surface of the substrate.

During the process, because the pressure within the film deposition compartment 25 is about 5 torr, for example, the process gas prepared in mixing space 21 is quickly accelerated under the driving force of the pressure gradient. The process gas rapidly enters the gas ejection head 23 so as to be jetted out downward from the jetting nozzles 22.

During this operation, the gas ejection head 23 is rotated along with the inner shell 5, and the rotation action promotes homogenization of the process gas by stirring and mixing the feed gas with the reactive gas due to the effect of the rotational force. Further, the centrifugal force acting on the mixing process gas promotes uniform flow of the process gas onto the entire surface of the substrate 28, thereby producing a film of uniform thickness and quality on the surface of the substrate 28. The spent gas is exhausted externally from the discharge port 29 provided on the sealed vessel 26.

As explained above, in the vaporizing apparatus of this embodiment, the vaporizer is integrally formed with the gas ejection head 23, and is assembled into a common casing (i.e., the outer shell 1 and the base section 2). Therefore, the vaporized feed material is supplied directly to the gas ejection head through a short passage without passing through distribution pipes. Further, the feed gas is heated and kept warm by a heating device common to the vaporizer and the gas ejection head 23. Thus, the vaporizer and gas ejection head 23 are thermally homogeneous, thereby preventing temperature variation during the transport step of the feed gas. Accordingly, the feed gas can be prevented from exhibiting a premature reaction, and formation of precipitation particles by the feed gas before reaching the deposition compartment can be avoided. Thus, a stable vapor phase deposition reaction in the film deposit compartment is promoted, without plugging of the passages or formation of unwanted particles causing potential contamination of the products.

Figure 5:
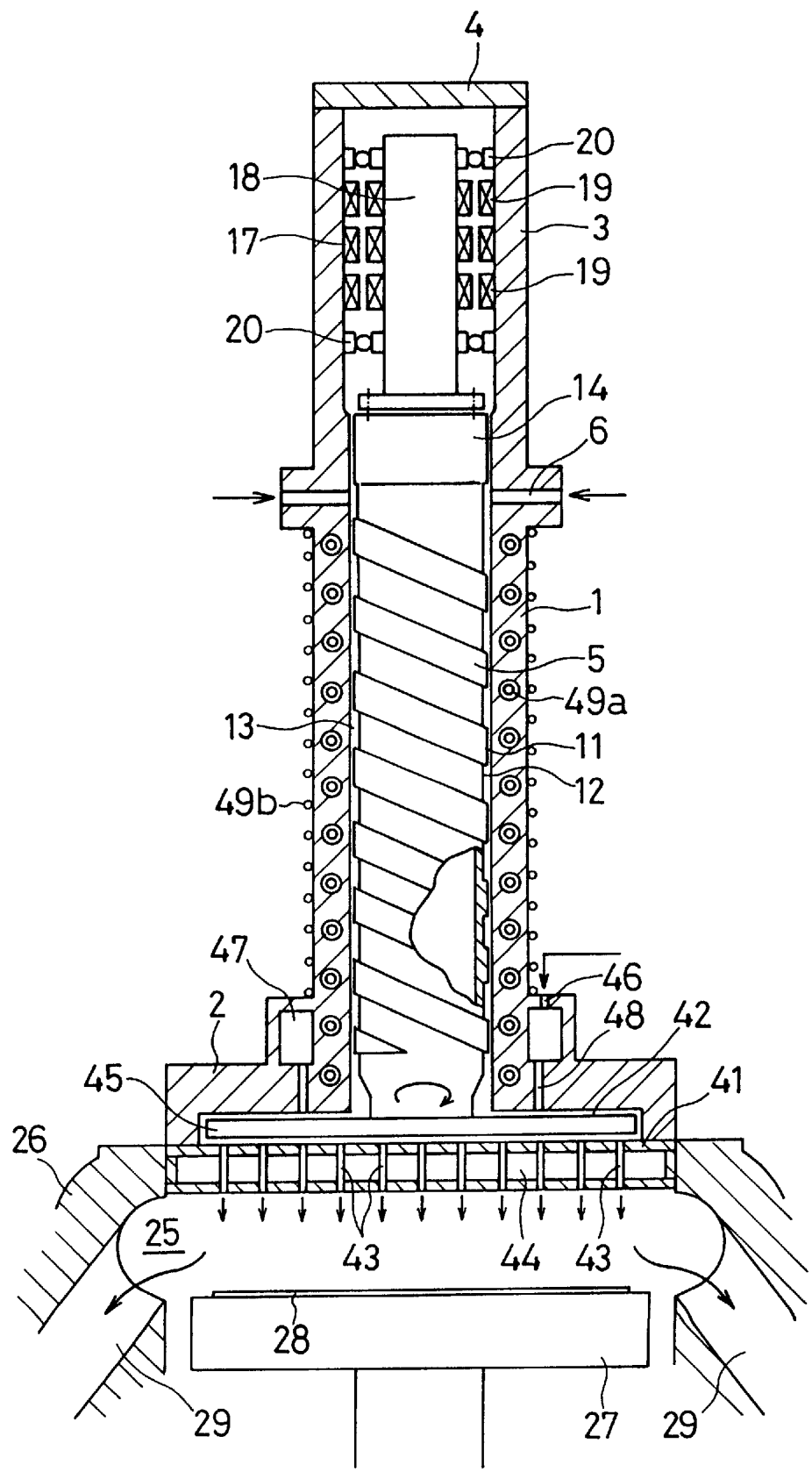
FIG. 5 is another embodiment of the vaporizer apparatus.

FIG. 5 shows another embodiment of the vaporizing apparatus. In this model, the gas ejection head 41 is fixed to the underside of the base plate 2 which also serves as the ceiling for the sealed vessel 26, and a mixing section 42 is formed therebetween. In the gas ejection head 41, there is a plurality of jetting nozzles 43, and an oil circulation passage 44 surrounding the jetting nozzles 43. The temperature of the oil is maintained at about 250° C. by such means as a temperature sensor and a controller device.

In this embodiment, the function of pressure generation is served by an impeller 45, which is sized to fit into the inner passage 24 and is coupled to the bottom end of the inner shell 5. Above the base plate 2 there are provided a reactive gas entry opening 46 to admit the reactive gas, gas dwell section 47 and a communication passage 48 to communicate the gas dwell section 47 with the mixing space 42. Also, the inner shell is made hollow to reduce its weight, and the heating device includes a high frequency heater 49a provided on the interior of the outer shell 1 and a coil heater 49b wound on the outer surface of the outer shell 1.

In this embodiment, the feed material is forced to descend progressively along the flow passage 13, by the action of the rotating inner shell 5, and is gradually vaporized and leaks into the mixing space 52. The action of the impeller 45 rotating as a unit with the inner shell 5 blocks the free downward motion of the feed material, so the feed gas is made to dwell in the flow passage 13 without expanding and while maintaining a high ambient pressure. After complete vaporization has been achieved, the vapor enters into the mixing space 42.

Within the mixing space 42, the admitted reactive gas and the feed gas are subjected to ample stirring and mixing by the rotational action of the impeller 45. Thereby, variations in film thickness and quality caused by the compositional distribution in the feed and reactive gas is prevented.

Figure 6:
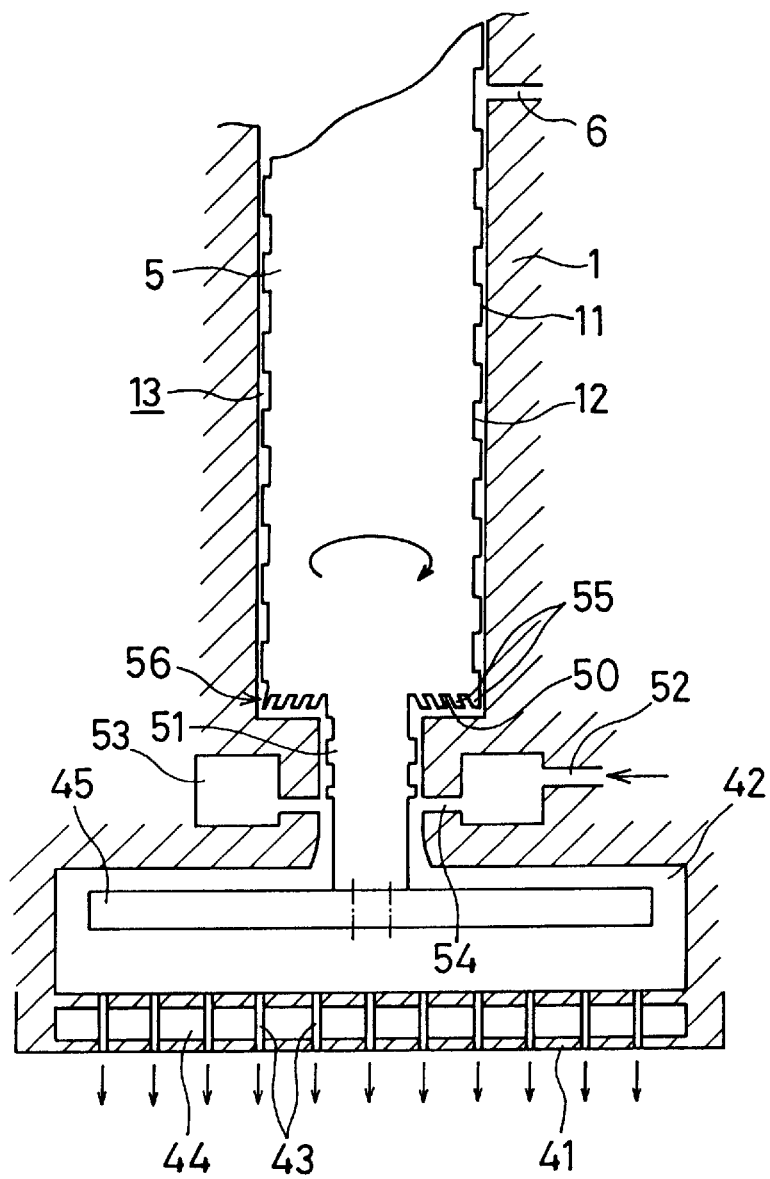
FIG. 6 is still another embodiment of the vaporizer apparatus.
Figure 7:
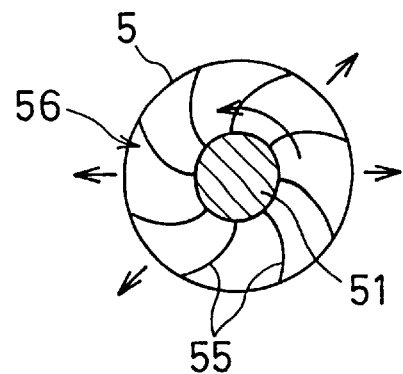
FIG. 7 is a schematic view of centrifugal vanes in the embodiment apparatus shown in FIG. 6.

FIGS. 6 and 7 show still other variations in the vaporizer apparatus. In this embodiment, the bottom of the inner shell is provided with a reduced diameter section 51 with at least one intervening stepped portion 50, and the reduced diameter section 51 is surrounded with reactive gas entry openings 52, a gas dwell section 53 and communication holes 54. At least one of the stepped portions 50 is provided with a pressure generation section constituted by a centrifugal impeller 56 having a plurality of vanes 55.

The centrifugal impeller 56 is arranged so as to reverse the flow low of the descending gas stream so that the feed gas descending along the flow low passage 13 is prevented from flowing freely past the pressure generation section. Therefore, the feed material can maintain a high pressure and dwells within the flow passage 13 without expansion. After complete vaporization, the feed gas enters into the mixing space 42.

In this embodiment, the mixing space 42 is made larger than the impeller 45. This impeller 45 is primarily for stirring and mixing the feed gas and the reactive gas, rather than for reversing the flow of the mixed process gas. In the apparatus shown in FIGS. 5, 6, the vaporizer apparatus forms a unit with the gas ejection head 23, and the mixed process gas does not undergo plugging or premature precipitation. Thus, a stable vapor phase deposition reaction in the film deposition compartment is promoted.

Although a certain preferred embodiment of the present invention has been shown and described in detail, it should be understood that various changes and modifications may be made therein without departing from the scope of the appended claims.

What is claimed is:

1. An apparatus comprising:
   an outer member having a cylindrical inner surface;
   an inner member having a cylindrical outer surface opposing said inner surface of said outer member, said outer member and said inner member being arranged for rotation relative to each other;
   a drive source connected to a rotating portion for rotating said rotating portion, said rotating portion comprising at least one of said outer member and said inner member;
   a feed liquid entry opening;
   a feed gas exit opening;
   a feed material passage formed on at least one of said inner surface of said outer member and said outer surface of said inner member, said feed material passage having a spiral configuration and communicating with said feed liquid entry opening and said feed gas exit opening; and
   a heating device for heating at least one of said outer member and said inner member.

2. The apparatus of claim 1, further comprising a reaction vessel, wherein said reaction vessel is attached to said outer member and said inner member at a downstream end of said feed material passage.

3. The apparatus of claim 1, further comprising a mixing space at a downstream end of said feed material passage, wherein feed gas from said feed material passage is mixed with a reactive gas in said mixing space.

4. The apparatus of claim 1, further comprising a pressure generation portion at a downstream end of said feed material passage for maintaining a back pressure of feed gas descending through said feed material passage.

5. The apparatus of claim 4, wherein said pressure generation portion communicates with said downstream end of said feed material passage and includes an impeller.

6. The apparatus of claim 5, further comprising a mixing space at a downstream end of said feed material passage, said impeller being positioned in said mixing space to mix feed gas from said feed material passage with reactive gas.

7. The apparatus of claim 4, wherein said pressure generation portion includes a convexoconcave surface formed on at least one of said outer member and said inner member.

8. The apparatus of claim 4, wherein at least one stepped portion is formed on one of said outer member and said inner member at a downstream end of said feed material passage, said pressure generation portion comprising a centrifugal impeller on at least one of said at least one stepped portion.

9. The apparatus of claim 1, further comprising a gas ejection head having nozzles for producing a feed gas flow onto a substrate, said gas ejection head communicating with a downstream end of said feed material passage.

10. The apparatus of claim 9, wherein said gas ejection head is integrally formed with one of said at least one of said outer member and said inner member of said rotating portion.

11. The apparatus of claim 10, wherein said rotating portion comprises only one of said outer member and said inner member, said gas ejection head being integrally formed with said rotating portion.

12. The apparatus of claim 11, wherein said rotating portion comprises said inner member.

13. An apparatus comprising:
    a stationary outer member having a cylindrical inner surface;
    a rotatable inner member having a cylindrical outer surface opposing said inner surface of said outer member;
    a feed liquid entry opening;
    a feed gas exit opening;
    a feed material passage formed on at least one of said inner surface of said outer member and said outer surface of said inner member, said feed material passage having a spiral configuration and communicating with said feed liquid entry opening and said feed gas exit opening; and
    a heating device for heating at least one of said outer member and said inner member.

14. An apparatus comprising:
    an outer member having a cylindrical inner surface;
    an inner member having a cylindrical outer surface opposing said inner surface of said outer member;
    a feed liquid entry opening;
    a feed gas exit opening;
    a feed material passage formed as a groove on at least one of said inner surface of said outer member and said outer surface of said inner member, said feed material passage having a spiral configuration and communicating with said feed liquid entry opening and said feed gas exit opening; and
    a heating device for heating at least one of said outer member and said inner member.

15. The apparatus of claim 14, wherein said outer member and said inner member are arranged such that a clearance is formed between said outer member and said inner member.

16. The apparatus of claim 14, further comprising a reaction vessel, wherein said reaction vessel is attached to said outer member and said inner member at a downstream end of said feed material passage.

17. An apparatus comprising:
    a vaporizer portion for generating a feed gas by heating a liquid material; and
    a gas ejection head for producing a feed gas flow onto a substrate;
    a casing housing said vaporizer portion and said gas ejection head such that said casing forms a thermally homogenous unit, said casing including a heating medium passage therein, said heating medium passage communicating with said vaporizer portion and said gas ejection head.

18. The apparatus of claim 17, wherein said vaporizer portion comprises:

an outer member having a cylindrical inner surface;

an inner member having a cylindrical outer surface opposing said inner surface of said outer member;

a feed liquid entry opening;

a feed gas exit opening;

a feed material passage formed on at least one of said inner surface of said outer member and said outer surface of said inner member, said feed material passage having a spiral configuration and communicating with said feed liquid entry opening and said feed gas exit opening; and a heating device for heating at least one of said outer member and said inner member.

19. The apparatus of claim 17, wherein said casing further includes a flow conditioning space communicating with said vaporizer portion and said gas ejection head, said gas ejection head including a plurality of nozzles, wherein said flow conditioning space accommodates volume expansion effects produced by a liquid-to-gas phase change in a feed material and distributes a feed gas to said plurality of nozzles.

20. The apparatus of claim 19, wherein the feed gas is defined as a first gas, said flow conditioning space including a supply passage for introducing a second gas into said flow conditioning space.

* * * * *